United States Patent

Kimura

[11] Patent Number: 5,974,040
[45] Date of Patent: Oct. 26, 1999

[54] RECEIVER AND TRANSMITTER-RECEIVER HAVING VARIABLE ATTENUATOR TO AVOID SATURATION BY A STRONG SIGNAL

[75] Inventor: Kouichi Kimura, Tokyo, Japan

[73] Assignee: OKI Electric Industry Co., Inc., Tokyo, Japan

[21] Appl. No.: 08/821,306

[22] Filed: Mar. 20, 1997

[30] Foreign Application Priority Data

Apr. 8, 1996 [JP] Japan ..................................... 8-085481

[51] Int. Cl.$^6$ .............................. H04B 7/212; H04J 3/00
[52] U.S. Cl. ...................... 370/337; 370/347; 455/249.1; 455/250.1
[58] Field of Search ..................................... 455/115, 116, 455/126, 127, 424, 561, 232.1, 234.1, 234.2, 245.1, 250.1, 249.1; 370/336, 337, 345, 347

[56] References Cited

U.S. PATENT DOCUMENTS 5,630,220  5/1997  Yano ..................................... 455/234.1

*Primary Examiner*—Alpus H. Hsu
*Assistant Examiner*—Mitchell Slavitt
*Attorney, Agent, or Firm*—Venable; James R. Burdett

[57] ABSTRACT

There are provided a receiver and a transmitter-receiver in which an automatic gain control loop is promptly performed and even in the case of a modulated wave having information in its amplitude, wave distortion can be eliminated. A received signal is received by an antenna and is amplified by a power amplifier. The gain of the received signal is attenuated by a variable attenuator in accordance with an output voltage of a holding circuit. After the signal is converted to an intermediate-frequency signal and amplified through a common procedure and detected, a comparator compares an output signal of the detector and a reference voltage $V_{ref}$, and obtains a signal indicating whether the output signal exceeds a reference voltage or a differential voltage therebetween. When the output signal or the differential voltage is brought to a positive level, a timing signal generating section generates a timing signal $T_m$, and the holding circuit holds a detection signal. In the variable attenuator, the signal is attenuated in accordance with the detection signal. Thereafter, output of the detector is integrated in a time constant circuit, and addition of respective outputs of the time constant circuit and the holding circuit is performed in a computing unit.

18 Claims, 5 Drawing Sheets

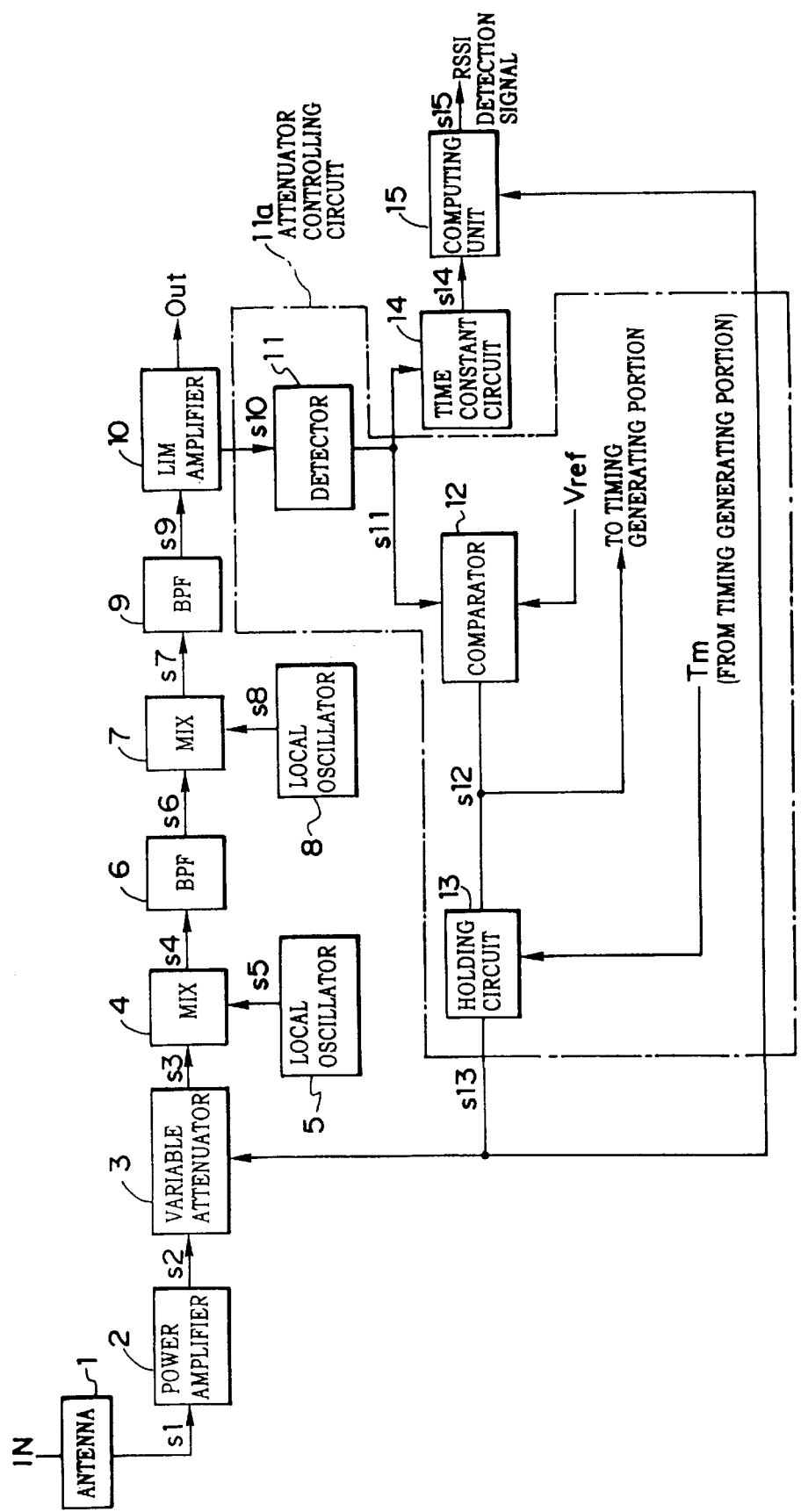
F I G. 1

F I G. 3A
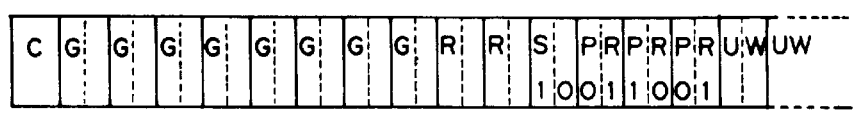
F I G. 3B
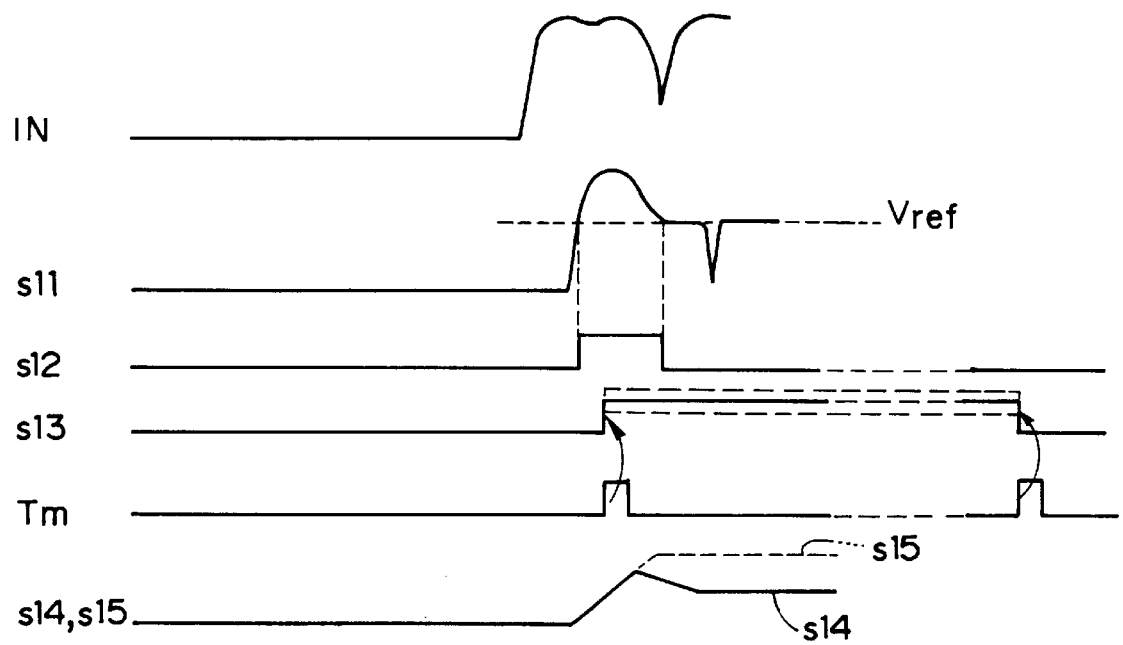

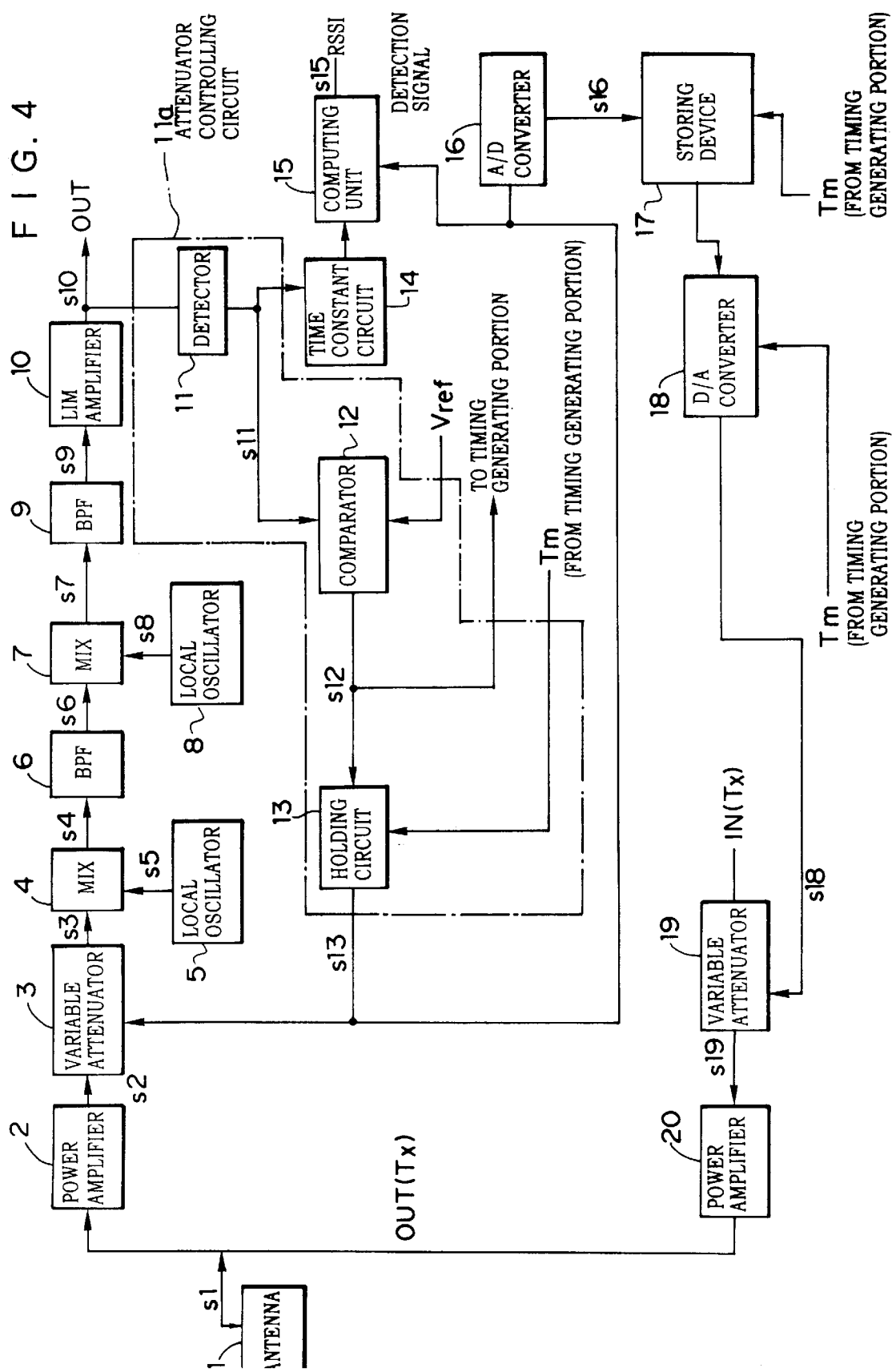

| RECEIVING SLOT 1 | RECEIVING SLOT 2 | RECEIVING SLOT 3 | RECEIVING SLOT 4 | TRANSMITTING SLOT 1 | TRANSMITTING SLOT 2 | TRANSMITTING SLOT 3 | TRANSMITTING SLOT 4 |
|---|---|---|---|---|---|---|---|

F I G. 5A

| ATTENUATOR DATA 1 | ATTENUATOR DATA 2 | ATTENUATOR DATA 3 | ATTENUATOR DATA 4 | ATTENUATOR DATA 1 | ATTENUATOR DATA 2 | ATTENUATOR DATA 3 | ATTENUATOR DATA 4 |
|---|---|---|---|---|---|---|---|

F I G. 5B

RECEIVER AND TRANSMITTER-RECEIVER HAVING VARIABLE ATTENUATOR TO AVOID SATURATION BY A STRONG SIGNAL

BACKGROUND OF THE INVENTION

1. Field of the Invention

The present invention relates to an attenuator controlling circuit provided in radio equipment such as a receiver or a transmitter-receiver, in which a time division multiple access (TDMA) system is adopted.

2. Description of the Related Art

In a TDMA system, a base station performs transmitting and receiving operations to and from a mobile station in accordance with a transmit-receive frequency assigned to the mobile station, and with a receiving slot and a transmitting slot within a frame. In this case, the receiving electric field varies according to the distance between the base station and the mobile station. For this reason, in order to prevent saturation of the receiving electric field and obtain the maximum output for a base band processing section, an attenuator is controlled such that the receiving power thereof is kept constant so as to cope with a change in the receiving electric field.

FIG. 2 is a functional block diagram of a conventional receiver in a base station.

In the receiver shown in this drawing, a signal inputted from an antenna 1 is amplified by a power amplifier 2 at a fixed gain, and the output is attenuated in a variable attenuator 3 in accordance with an output voltage of a comparator 12 which is considered to be a control signal.

Frequency conversion is carried out by a mixer (which will be hereinafter referred to as MIX) 4 and a local oscillator 5. The input signal is converted to an intermediate frequency lower than that of the input signal, and the frequency band is limited by a band pass filter (which will be hereinafter referred to as BPF) 6. Frequency conversion is further carried out by a local oscillator 8 and MIX 7, and the frequency band is further limited by BPF 9.

The thus obtained signal is amplified in a limit amplifier (which will be hereinafter referred to as LIM amplifier) 10 at a fixed gain up to an amplitude in which base band processing is allowed, and a modulation envelope is detected at a detector 11. A differential voltage between an output of the detector 11 and a reference voltage $V_{ref}$ which indicates power in which LIM amplifier 10 is not saturated, is obtained in the comparator 12. The gain of the received signal is attenuated by the variable attenuator 3 with the thus obtained differential voltage as the control voltage. Through the above-described process, the received signal is controlled in a fixed receiving electric field.

However, the conventional receiver has the following drawbacks.

When the signal is controlled in the fixed receiving electric field of the receiver as described above, there exists a drawback in that a modulated signal such as a π/4-shift QPSK signal, which has information in its amplitude, loses amplitude information and is thereby not demodulated correctly.

In order to overcome the above drawback, there has been adopted a method in which an output of the detector 11 is integrated by a time constant circuit, and a timing for synchronization with a TDMA frame is controlled by a timing signal generating means in a control section so as to control a gain to be attenuated in the variable attenuator 3.

However, in this method, when there is no burst wave, the gain to be attenuated in the variable attenuator 3 is 0 dB. For this reason, when the burst wave is thereafter inputted, an input modulated signal is greatly amplified. When the receiving electric field of the burst wave is large, saturation is caused. In addition, since integration of the output of the detector 11 is effected by the time constant circuit, more time for integration is required. As a result, there exists a drawback in that an AGC (Automatic Gain Control) loop cannot respond, and a head portion of the input signal is thereby distorted.

SUMMARY OF THE INVENTION

In view of the above-described circumstances, there is provided a receiver which comprises: a variable attenuator which, on the basis of a control signal, variably attenuates modulated waves of a plurality of channels received by an antenna, wherein a plurality of receiving slots are assigned by a time division multiplexing system; a power amplifier which amplifies power at a fixed gain; a detector which detects power of a modulated wave of a desired channel; a comparator which compares an output signal of the detector and a reference voltage which indicates a level at which no saturation of an output signal of the power amplifier is caused, and outputs, as a detected signal, a signal which indicates whether the output signal exceeds the reference voltage or the differential voltage therebetween; a timing generating section which, on the basis of the detected signal, generates a timing signal synchronized with a timing of the receiving slot of the desired channel; and a holding circuit which, on the basis of the timing signal, holds the output signal of the comparator and outputs the control signal to the variable attenuator.

Since the receiver of the present invention has the above-described structure, when the detected signal exceeds the reference voltage, the timing signal synchronized with the receiving slot is instantaneously generated by the timing generating section, and the detected signal is held by the holding circuit. The voltage held by the holding circuit controls an amount to be attenuated in the variable attenuator (hereinafter referred to occasionally as an amount of attenuation). Accordingly, even at the rising edge of a burst signal, saturation is prevented. Further, since the amount to be attenuated in the variable attenuator is made constant by the timing signal for each of the receiving slots, a modulated wave having information in its amplitude can be demodulated properly.

Further, in the transmitter-receiver of the present invention, when a transmitting and receiving operation is effected between a plurality of mobile stations and the base station, a transmitter is used in which the output of the holding circuit is written into a storing device, and during the transmission, the written data is read out to be used as an amount of attenuation.

The transmitter-receiver constructed as above has the same advantages as those of the above receiver. In addition, since the amount of attenuation in the variable attenuator during the receiving operation performed in the base station is used also for power control during the transmitting operation, saturation of the mobile station can be prevented without the transmitter-receiver in the mobile station being provided with a controlling function of an attenuator.

BRIEF DESCRIPTION OF THE DRAWINGS

FIG. 1 is a functional block diagram of a receiver according to a first embodiment of the present invention.

FIGS. 3A and 3B are explanatory drawings each illustrating an operation of FIG. 1.

FIG. 4 is a functional block diagram of a transmitter-receiver according to a second embodiment of the present invention.

FIGS. 5A and 5B are explanatory drawings each illustrating an operation of FIG. 4.

DESCRIPTION OF THE PREFERRED EMBODIMENTS

[First Embodiment]

Figure 2:
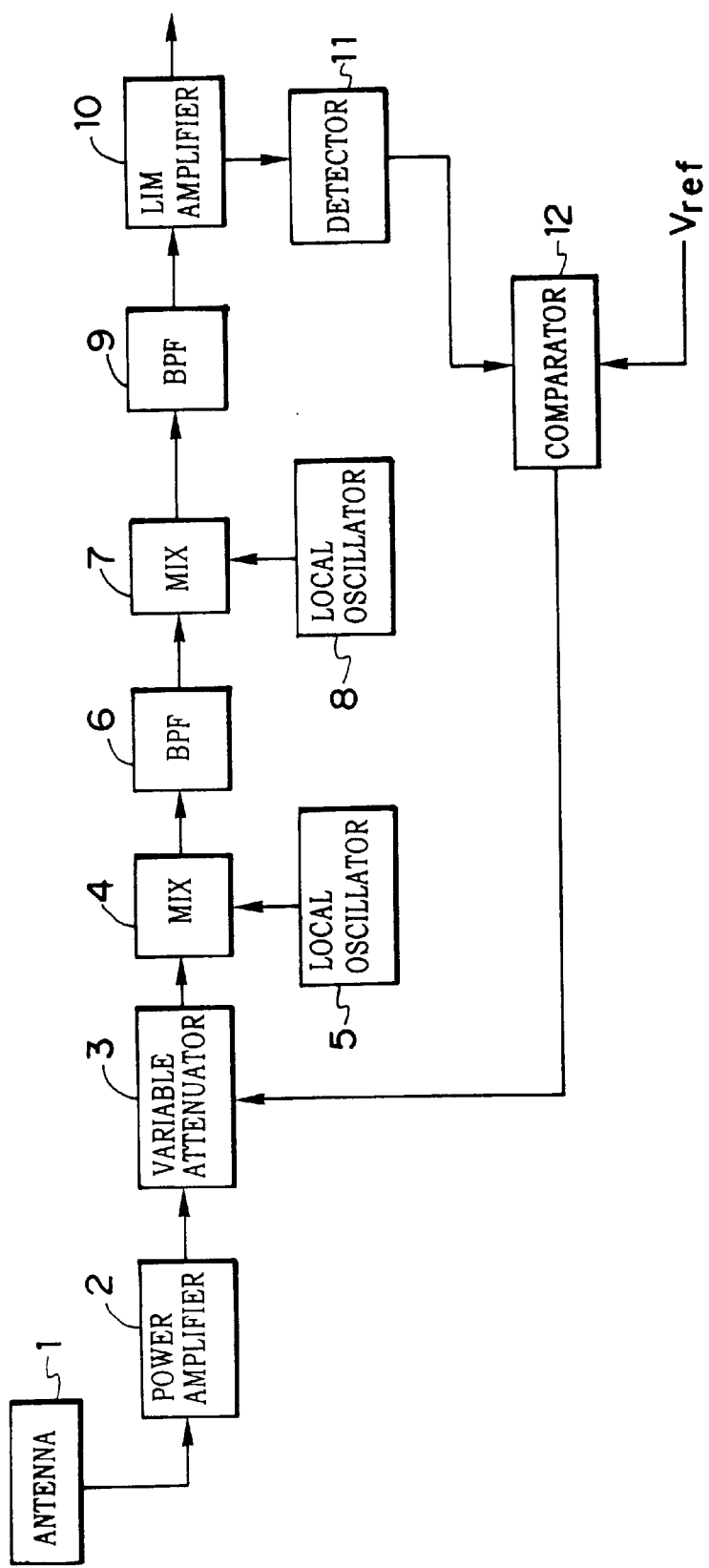
FIG. 2 is a functional block diagram of a conventional receiver.

FIG. 1 is a functional block diagram of a receiver according to a first embodiment of the present invention, and the same members as those shown in FIG. 2 will be denoted by the same reference numerals.

The receiver of the first embodiment is different from the conventional receiver in that control is effected such that an amount to be attenuated in the variable attenuator 3 becomes fixed in each receiving slot, and the amount of attenuation in the variable attenuator 3 is added to an RSSI (Received Signal Strength Indication) signal.

As shown in FIG. 1, the receiver of the first embodiment includes an antenna 1, a power amplifier 2, a variable attenuator 3, MIX 4, a local oscillator 5, BPF 6, MIX 7, a local oscillator 8, BPF 9, LIM amplifier 10, a detector 11, a comparator 12, a holding circuit 13, a time constant circuit 14, and a computing unit 15.

An output signal (hereinafter referred to as an "output") s1 of the antenna 1 is received by an input terminal of the power amplifier 2. Output s2 of the power amplifier 2 is connected to an input terminal of the variable attenuator 3. Output s3 of the variable attenuator 3 and output s5 of the local oscillator 5 are connected to an input terminal of MIX 4. Output s4 of MIX 4 is connected to an input terminal of BPF 6.

Output s6 of BPF 6 and output s8 of the local oscillator 8 are connected to an input terminal of MIX 7. Output s7 of MIX 7 is connected to an input terminal of BPF 9. Output s9 of BPF 9 is connected to an input terminal of the LIM amplifier 10. Output s10 of the LIM amplifier 10 is connected to an input terminal of the detector 11 and also to an input terminal of an unillustrated demodulating circuit.

Output s11 of the detector 11 is connected to one input terminal of the comparator 12 and also to an input terminal of the time constant circuit 14. Connected to another input terminal of the comparator 12 is a reference voltage $V_{ref}$. Output s12 of the comparator 12 is connected to an input terminal of the holding circuit 13 and also to an input terminal of a timing signal generating section of an unillustrated control section.

Output s13 of the holding circuit is connected also to a control-voltage input terminal of the variable attenuator 3 and to one input terminal of the computing unit 15. Output s14 of the time constant circuit 14 is connected to another input terminal of the computing unit 15. An RSSI detection signal s15, which is an output of the computing unit 15, is connected to an input terminal of the unillustrated control section.

The detector 11, comparator 12, holding circuit 13, and unillustrated timing signal generating section together form an attenuator controlling circuit 11a.

The receiver of the first embodiment is to be provided in the base station. The power amplifier 2 is used for improvement of NF (Noise Figure). The variable attenuator 3 is used for variably attenuating the signal inputted through the antenna in accordance with the signal s13 inputted to the control-voltage input terminal. The local oscillator 5 is used to generate high-frequency carriers. MIX 4 is a mixer, BPF 6 is a filter used to limit the input signal to a band of intermediate frequency (IF), MIX 7 is a mixer, BPF 9 is another filter used to further limit to a band of intermediate frequency (IF), and the LIM amplifier 10 is a non-linear fixed amplifier for amplifying power of the input modulated wave up to the maximum amount thereof for carrying out the base band process without causing saturation of power of a modulated wave. The detector 11 is used to effect an envelope detection of the power.

The comparator 12 is formed by an operational amplifier and is a circuit for obtaining a differential voltage between the output s11 of the detector 11 and the reference voltage $V_{ref}$. The holding circuit 13 is also formed by an operational amplifier and is used for holding the output s12 of the comparator 12 in accordance with a timing signal $T_m$. The time constant circuit 14 is an integrator which effects integration at an RC time constant. The computing unit 15 is an adder formed by an operational amplifier. The unillustrated control section includes the timing signal generating section and the like and controls the synchronization with the receiving slot.

FIGS. 3A and 3B are explanatory drawings each illustrating the operation of FIG. 1. FIG. 3A shows a timing format of the TDMA frame as being sent, and FIG. 3B is a timing chart of FIG. 1 when a π/4-shift QPSK modulated signal is used.

The operation the arrangement shown in FIG. 1 will be hereinafter described with reference to FIGS. 3A and 3B.

The TDMA communication channel is transmitted from the mobile station to the base station using a receiving format as shown in FIG. 3A. Numeral C shown in FIG. 3A designates the end of the preceding slot, numeral G designates a guard bit for preventing mutual interference between the preceding slot and a given slot, numeral R designates a ramp bit, numeral S designates a start bit of the given slot, numeral PR designates a preamble bit of the given slot, and numeral UW designates a unique word of the given slot.

The antenna 1 of the base station receives, for example, a π/4-shift QPSK modulated wave IN as shown in FIG. 3B, and outputs the same to the power amplifier 2. The power amplifier 2 amplifies the modulated signal s1 at a fixed gain (for example, 10 dB) for an improvement of NF, and outputs the amplified signal s2 to the variable attenuator 3. The variable attenuator 3 attenuates the output s2 of the power amplifier 2 in accordance with the output s13 of the holding circuit 13 inputted to the control-voltage input terminal, which indicates an amount of attenuation.

When a frame of a receiving channel is not used and no burst signal exists, the output s13 of the holding circuit 13 is 0 V, i.e., the amount of attenuation by the variable attenuator 3 is 0 dB. Accordingly, in a rising period of the burst signal of the frame, the signal at the rising edge of the burst signal is amplified, with the amount to be attenuated by the variable attenuator 3 being 0 dB.

MIX 4 and the local oscillator 5 convert the signal to an intermediate frequency (IF) lower than that of the input signal IN, and output the signal s4 to BPF 6. BPF 6 limits the input signal to the intermediate-frequency (IF) band, and output the signal s6 to MIX 7. MIX 7 and the local oscillator 8 convert the signal to an even lower frequency (IF), and output the signal s7 to BPF 9. BPF 9 effects IF band limitation and outputs the signal s9 to the LIM amplifier 10. As a result, a modulated wave of only a desired channel can be obtained from among a plurality of channels.

The LIM amplifier 10 amplifies the signal at a fixed gain (for example, 60 dB) up to an amplitude in which the base band process is allowed, and outputs the signal s10 to an unillustrated demodulating circuit and also to the detector 11. The detector 11 effects envelope detection of the power of the signal s10, and outputs the signal s11, which indicates power of the modulated signal, to the comparator 12 and to the time constant circuit 14.

In the comparator 12, the output s11 of the detector 11 and the reference voltage $V_{ref}$, which indicates a level at which no saturation of the LIM amplifier 10 is caused are compared with each other. Either a signal that indicates whether the output s11 exceeds the reference voltage $V_{ref}$ (if the reference voltage $V_{ref}$ is larger than the output s11, the differential voltage is 0 V), or the differential voltage therebetween which is considered as the detected signal s12, is outputted to the holding circuit 13 and also to the timing signal generating section of the unillustrated control section.

In the timing signal generating section of the control section or the like, when the detected signal s12 is brought to a positive level, a timing signal $T_m$ indicated by a pulse (whose width is set in accordance with the time of one symbol and the characteristic of the modulated wave) is generated so that the output s12 of the comparator 12 is held by the holding circuit 13, and the generated timing signal is outputted to the holding circuit 13. The holding circuit 13 holds the output s12 of the comparator 12 at the rising edge of the pulse of the timing signal $T_m$, and outputs the signal s13 to the variable attenuator 3.

Accordingly, in the receiving slot, as long as the input power of the LIM amplifier 10 does not exceed a value indicated by the reference voltage $V_{ref}$, no pulse is generated in the timing signal $T_m$. Therefore, the holding circuit 13 is kept in a state of holding 0 V which indicates that the amount of attenuation is 0 dB. In other words, when the power of the receiving electric field is smaller than the reference value, even if the amount to be attenuated by the variable attenuator 3 is 0 dB, no saturation of the LIM amplifier 10 is caused, and it is therefore unnecessary for the holding circuit 13 to effect an attenuation controlling process.

In the variable attenuator 3, the output s13 of the holding circuit 13 is inputted to the control-voltage input terminal, and the output is attenuated by a gain which corresponds to the differential voltage (indicated by the signal s13) between the output voltage of the detection circuit 11 and the reference voltage $V_{ref}$. (Given that the differential voltage is a V, when a V corresponds to b dB, the amount of attenuation is b dB. Refer to the broken line portion of s13 shown in FIG. 3B.) Further, at the variable attenuator 3, the signal s3 is outputted to MIX 4.

In the timing signal generating section, when the receiving slot has been completed, the timing signal $T_m$ which is indicated by the pulse is generated so as to hold the output s12 of the comparator 12 by the holding circuit 13. The holding circuit 13 holds the output s12 of the comparator 12 at the rising edge of the pulse of the timing signal $T_m$, and outputs the signal s13 to the variable attenuator 3. At the timing when the receiving slot is completed, the differential voltage becomes 0 V, and the holding circuit 13 holds 0 V accordingly.

Namely, the amount of attenuation by the variable attenuator 3 is fixedly controlled for each receiving slot, and when the receiving slot is completed, the amount of attenuation by the variable attenuator 3 becomes 0 dB. In addition, in the variable attenuator 3, when the detection signal 11s is brought to a positive level, an attenuation controlling process is promptly carried out by the timing signal generating section, and saturation of the receiver is thereby prevented. Moreover, since the variable attenuator 3 is controlled at a fixed gain in each receiving slot, even in the case of a modulated wave including information in its amplitude such as a π/4-shift QPSK signal, there is no possibility that wave-form distortion occurs.

On the other hand, the time constant circuit 14 integrates the output s11 of the detector 11 at a CR time constant, and outputs the output s14 to the computing unit 15. This integration is effected so that the detection signal is integrated to become constant. Without this integration, an amplitude ratio of the modulating wave whose amplitude varies, for example, a π/4-shift QPSK modulated wave, reaches close to of 14 dB, and an error is likely to occur at a measuring point of the power in the receiving electric field.

The computing unit 15 adds the output s14 of the time constant circuit 14 and the output s13 of the holding circuit 13, and outputs an RSSI signal s15 to the unillustrated control section. The RSSI signal here is obtained by adding voltage s13, which indicates the amount of attenuation performed by the variable attenuator 3, to the output s11 of the detector 11, and thereby indicates the receiving electric field of the modulated signal of the input signal. The control section is used to prevent interference of the RSSI signal as follows. An empty slot is checked prior to use of the slot. When the RSSI signal has a value which is less than or equal to a certain value, the slot is considered to be an empty slot and is used. When the RSSI signal has a value which is greater than the certain value, a signal of a different frequency or a different slot is used.

As described above, in accordance with the first embodiment of the present invention, the controlling of the variable attenuator within the slot is performed at a fixed value by the timing signal synchronized with the receiving timing slot. Even in a case of an input signal such as a π/4-shift QPSK signal, in which a variation in amplitude occurs, the variable attenuator is controlled appropriately for each slot without causing any signal distortion.

Further, in the present first embodiment, the output of the detector is compared with the reference voltage, without the output of the detector being integrated. For this reason, the variable attenuator is controlled with a minimum delay of the receiver. Compared with a method in which the variable attenuator is controlled on the basis of the voltage integrated by the control section, saturation of a non-linear circuit such as a power amplifier or the like can be instantly prevented, and it is not necessary to take into account a delay caused due to a communication distance, in a case in which the base station receives a slot from the mobile station. (Otherwise, since the slot is delayed by a propagation delay time, in order to control the power of the receiving electric field for the slot at a fixed value, it is necessary to take into account the propagation delay time in order to control the power of the receiving electric field for the receiving slot.)

Moreover, since integration is performed by adding a voltage that corresponds to an amount of attenuation to be made by the variable attenuator to the output of the detector, the dynamic range of an RSSI detected voltage of the input signal IN of the receiver expands for an amount of attenuation for controlling the variable attenuator, so that the input signal itself can be comprehended. As a result, diagnosis of communication line quality such as prevention of interference can be correctly effected.

[Second Embodiment]

FIG. 4 is a functional block diagram of a transmitter-receiver of a base station according to a second embodiment of the present invention. Note that the same members as those shown in FIG. 1 will be denoted by the same reference numerals.

The transmitter-receiver of the base station according to the second embodiment is different from a conventional transmitter-receiver in that an amount by which a received signal is to be attenuated is measured for each receiving slot, and when a transmitting slot is transmitted to a corresponding mobile station, a predetermined amount is attenuated in advance from the transmitting power, thereby obviating controlling of the variable attenuator in the transmitter-receiver of the mobile station side.

As shown in FIG. 4, the transmitter-receiver of the base station according to the second embodiment includes an antenna 1, a power amplifier 2, a variable attenuator 3, MIX 4, a local oscillator 5, BPF 6, MIX 7, a local oscillator 8, BPF 9, LIM amplifier 10, a detector 11, a comparator 12, a holding circuit 13, a time constant circuit 14, a computing unit 15, an analog/digital (which will be hereinafter referred to as A/D) converter 16, a storing device 17, a digital/analog (which will be hereinafter referred to as D/A) converter 18, a variable attenuator 19, and a power amplifier 20.

Output s1 of the antenna 1 is connected to an input terminal of the power amplifier 2. Output s13 of the holding circuit 13 is connected to an input terminal of the variable attenuator 3 and also to an input terminal of the A/D converter 16. The output of the A/D converter 16 is connected to an input terminal of the storing device 17.

Another input terminal of the storing device 17 for a read/write operation of the storing device 17 receives to a timing signal $T_m$ of an unillustrated timing signal generating section. An output terminal of the storing device 17 is connected to an input terminal of the D/A converter 18. A timing-signal input terminal of the D/A converter 18 receives to the timing signal $T_m$ of the timing signal generating section. Output s18 of the D/A converter 18 is connected to a control-voltage input terminal of the variable attenuator 19.

An input terminal of the variable attenuator 19 is also connected to output IN(Tx) of an unillustrated modulating circuit. Output s19 of the variable attenuator 19 is connected to an input terminal of the power amplifier 20. Output OUT (Tx) of the power amplifier 20 is connected to the input terminal of the antenna 1.

The detector 11, comparator 12, holding circuit 13, and unillustrated timing signal generating section form an attenuator controlling circuit 11a.

The A/D converter 16 is a circuit for converting the output s13 of the holding circuit 13 to a digital signal, and the storing device 17 is a circuit in which an amount of attenuation in each receiving slot is stored. The D/A converter 18 is a circuit that converts the amount of attenuation in each receiving slot stored in the storing device 17 to a voltage at the time of being held by the holding circuit 13 in accordance with the timing signal $T_m$, and holds the voltage. The variable attenuator 19 is a circuit which variably attenuates the transmitting signal IN (Tx) in accordance with the output s18 of the D/A converter 18. The power amplifier 20 is a fixed-gain amplifier for outputting a transmission power which is equal to the transmission power transmitted from the mobile station.

FIGS. 5A and 5B are diagrams each illustrating the operation shown in FIG. 4. FIG. 5A shows a case in which the slot structure of a TDMA-TDD system is formed as a four-slot structure. FIG. 5B shows an attenuation controlling operation.

The operation shown in FIG. 4 will be hereinafter described with reference to FIGS. 5A and 5B.

As shown in FIG. 5A, when the slot structure of a TDMA-TDD system is formed as a four-slot structure, four receiving slots 1 through 4, which the base station receives from four mobile stations, and four transmitting slots 1 through 4, which are to be transmitted from the base station to the respective mobile stations in correspondence with the respective receiving slots, are assigned to each frame.

(a) Receiving Operation

Each mobile station transmits a transmitting signal according to a predetermined format to the base station. For example, a π/4-shift QPSK modulated wave is transmitted in a period of an assigned transmitting slot (in FIG. 5A, any one of the transmitting slots 1 through 4) at a fixed transmission power.

The base station receives the transmitted signal from each mobile station by the antenna 1, and outputs the received signal s1 to the power amplifier 2.

The power amplifier 2 amplifies the modulated signal s1 at a fixed gain (for example, 10 dB) for an improvement of NF, and outputs the amplified signal s2 to the variable attenuator 3. The variable attenuator 3 attenuates the output s2 of the power amplifier 2 in accordance with the output s13 of the holding circuit 13, wherein the output s13 indicates an amount to be attenuated and is inputted to the control-voltage input terminal.

MIX 4 and the local oscillator 5 convert the signal to an intermediate frequency (IF) lower than that of the input signal IN, and output the signal s4 to BPF 6. BPF 6 limits the input signal to the intermediate-frequency (IF) band, and outputs the signal s6 to MIX 7. MIX 7 and the local oscillator 8 convert the signal to an even lower intermediate frequency (IF), and output the signal s7 to BPF 9. BPF 9 effects IF band limitation, and outputs the signal s9 to the LIM amplifier 10. As a result, a modulated wave of only a desired channel can be obtained from among a plurality of channels.

The LIM amplifier 10 amplifies the signal at a fixed gain (for example, 60 dB) up to an amplitude in which base band processing is allowed, and outputs the signal s10 to an unillustrated demodulating circuit and also to the detector 11. The detector 11 effects envelope detection of the power of the signal s10, and outputs a detection signal s11, which indicates the power of the modulated signal, to the comparator 12 and to the time constant circuit 14.

In the comparator 12, the output s11 of the detector 11 and the reference voltage $V_{ref}$, which indicates the power of the receiving electric field which causes no saturation of the receiver, are compared with each other, and either a signal that indicates whether the output s11 exceeds the reference voltage $V_{ref}$ (if the reference voltage $V_{ref}$ is larger than the output s11, the differential voltage is 0 V), or the differential voltage therebetween which is regarded as the detected signal s12, is outputted to the holding circuit 13 and also to the timing signal generating section of the unillustrated control section.

It is to be noted that since each mobile station transmits a signal to the base station at a fixed transmission power, when the distance between the mobile station and the base station is short, the amount by which the transmitting signal is attenuated is small. For this reason, the output s11 of the detector 11 of the receiving electric field to be received in the base station exceeds the reference voltage $V_{ref}$. When the distance between the mobile station and the base station is great, the amount by which the transmitting signal is attenuated before reaching the base station becomes large, and the output s11 of the detector 11 of the receiving electric field to be received by the base station does not exceed the reference voltage $V_{ref}$.

In the timing signal generating section of the control section or the like, the timing signal $T_m$ is generated for each receiving slot synchronously with the timing of the receiving slot so that the gain of the variable attenuator 3 for each receiving slot becomes constant, and the timing at which the output s12 of the comparator 12 is held by the holding circuit 13 is controlled.

The holding circuit 13 holds the output s12 of the comparator 12 at the rising edge of the pulse of the timing signal $T_m$, and outputs the signal s13 to the control-voltage input terminal of the variable attenuator 3. The variable attenuator 3 attenuates an amount of a gain corresponding to the differential voltage s12 in accordance with the output s13 of the holding circuit 13. As a result, the variable attenuator 3 is controlled at a fixed amount of attenuation in each receiving slot.

Immediately before each receiving slot is completed, the timing signal generating section generates the timing signal $T_m$, which indicates the timing at which digital numerical data is written in the storing device 17 by the A/D converter 16, and generates a signal that indicates a region corresponding to each receiving slot, and outputs these signals to the storing device 17. The storing device 17 allows the output s16 of the A/D converter 16 to be written into the region corresponding to the receiving slot. As a result, as shown in FIG. 5B, the storing device 17 stores attenuator data 1 through 4 which are digital values of the respectively connected receiving slots 1 through 4.

(b) Transmitting Operation

When the base station transmits the transmitting slots 1 through 4 to the respective mobile stations, at the beginning of each transmitting slot, the timing signal generating section generates the timing signal $T_m$, which indicates the timing for reading from the storing device 17 the respective attenuator data of the receiving slots 1 through 4 that correspond to the transmit slots 1 through 4 and are stored in the storing device 17, and also generates a signal indicating the region in which the above data are stored, and outputs these signals to the storing device 17. The storing device 17 reads out the attenuator data of the receiving slots corresponding to the transmitting slots in accordance with the timing signal $T_m$, and outputs these data to the D/A converter 18.

Further, at the beginning of each transmitting slot, the timing signal generating section generates the timing signal $T_m$ which indicates a timing at which D/A conversion is performed in the D/A converter 18 and a timing for holding the data, and outputs the same to the D/A converter 18. The D/A converter 18 in turn effects digital-to-analog conversion so as to convert the attenuator data into the voltage held by the holding circuit 13, and holds the same.

The output voltage s18 held by the D/A converter 18 is outputted to the control-voltage input terminal of the variable attenuator 19. The variable attenuator 19 inputs data IN (Tx) of the transmitting slot outputted from the modulating circuit, attenuates the same for an amount of gain corresponding to the voltage s18 inputted to the control-voltage input terminal (i.e., an amount of attenuation in the receiving slot), and outputs the signal s19 to the power amplifier 20. The power amplifier 20 amplifies the signal at a fixed gain, and outputs the transmitting signal OUT (Tx). The transmitting signal OUT (Tx) allows transmission of the transmitting slot to the mobile station through the antenna 1.

The mobile station receives the transmitting slot from the base station, but the base station has already attenuated the transmitting slot by an amount of attenuation which was applied to the receiving slot from the mobile station at a fixed transmission power. (Assuming that the base station transmits the transmitting slot to the mobile station at a fixed transmission power, in the mobile station, the input power of the LIM amplifier of the transmitting slot exceeds $V_{ref}$ for an amount of attenuation applied to the receiving slot received by the base station. As a result, it is necessary for the mobile station to attenuate the transmitting slot by the same amount.) Thus, even when the amount to be attenuated by the variable attenuator of the receiver is set to 0 dB, no saturation is caused. In other words, it is not necessary for the mobile station to control the variable attenuator of the transmitter-receiver at all.

As described above, the second embodiment has the same advantages as those of the first embodiment. In addition, since, in the base station, the amount to be attenuated in the variable attenuator at the time of receiving is used for the power control at the time of transmission, it is possible to prevent saturation of the mobile station even without the transmitter-receiver of the mobile station being provided with the function of controlling the attenuator.

It is to be noted that the present invention is not limited to the above-described embodiments, and various modified examples such as the following can also be applied.

(1) Although in each of the first and second embodiments the variable attenuator is controlled by using analog signals, it is also possible to control the variable attenuator at a fixed amount of attenuation on the basis of a determination as to whether the detection voltage exceeds the reference voltage $V_{ref}$. In this case, in the second embodiment, the A/D converter and the D/A converter are not required, and as the data to be stored in the storing device, only the data that indicates whether the attenuator has been controlled for each of the slots is stored.

(2) The order in which the power amplifier 2 and the variable attenuator 3 are arranged may be reversed.

(3) In each of the first and second embodiments, a description is given about the receiver in the base station. However, the present invention can also be applied to the receiver in the mobile station. In the second embodiment, attenuation control of the receiving slot and the transmitting slot can be effected by the transmitter-receiver in each of the mobile stations, and it is not necessary for the base station to effect attenuation control of these slots. In this case, an arrangement is possible in which, when the last timing of the receiving slot immediately before the receiving slot assigned to the mobile station and the detection signal each indicate a positive voltage, the output of the holding circuit 13 is fed to the control-voltage input terminal of the variable attenuator 19 so that a pulse is generated in the timing signal $T_m$.

(4) The order in which the time constant circuit 14 and the computing unit 15 are arranged may be reversed.

As described above, in accordance with the present invention, controlling of the variable attenuator within the slot is performed at a fixed value by a timing signal synchronized with the receiving timing slot, and even in the case of an input signal, whose amplitude varies, such as a π/4-shift QPSK signal, the variable attenuator is appropriately controlled for each slot without generating signal distortion.

Further, in accordance with the present invention, the variable attenuator is controlled at a minimum delay of the receiver. Compared with a method in which the valuable attenuator is controlled on the basis of the voltage integrated by the control section, saturation of a non-linear circuit of the power amplifier or the like can be instantly avoided, so that there is no need to take into account the delay caused by the communication distance between the base station and the mobile station when the base station receives a slot from the mobile station.

What is claimed is:

1. A receiver for receiving modulated waves of a plurality of channels in which a plurality of slots are assigned by a time division multiplexing method, said receiver comprising:
   an antenna which receives a modulated wave of each of the plurality of channels;
   a variable attenuator which attenuates an input signal at a variable amount of attenuation on the basis of a control signal;
   a power amplifier which amplifies power at a fixed gain;
   a circuit which extracts a modulated wave of a desired channel out of the modulated waves of the plurality of channels;
   a detector which detects power of the modulated wave of the desired channel;
   a comparator which compares an output signal of said detector and a reference voltage indicating a level at which no saturation of an output signal of said power amplifier is caused, and outputs a detection signal which indicates whether the output signal of said detector exceeds the reference voltage;
   a timing signal generating section which, on the basis of the detected signal outputted from said comparator, generates a timing signal for controlling said variable attenuator at a fixed amount of attenuation from a time at which the detected signal exceeds the reference voltage to a time at which a receiving slot of the desired channel has been completed; and
   a holding circuit which, on the basis of the timing signal, holds the output signal of said comparator and outputs the control signal to said variable attenuator.

2. A receiver according to claim 1, further comprising:
   an integrator which integrates one of the output signal of said detector and a signal obtained on the basis of the output signal; and
   a computing unit which performs addition of the output signal of said integrator and the output signal of said holding circuit.

3. A receiver according to claim 1, wherein when the detected signal indicates that the output signal exceeds the reference voltage and when the receiving slot of the desired channel has been completed, the detected signal outputted from said comparator is held by said holding circuit synchronously with a rising edge of the timing signal.

4. A transmitter-receiver for transmitting and receiving modulated waves of a plurality of channels in which a plurality of slots are assigned by a time division multiplexing method, said transmitter-receiver being provided in a base station, which effects a receiving and transmitting operation with a plurality of mobile stations, wherein a receiver of said transmitter-receiver comprises:
   an antenna which receives a modulated wave of each of the plurality of channels, the wave being transmitted from each of the mobile stations at a fixed transmission power;
   a first variable attenuator which attenuates an input signal at a variable amount of attenuation on the basis of a first control signal;
   a first power amplifier which amplifies power at a fixed gain;
   a circuit which extracts a modulated wave of a desired channel out of the modulated waves of the plurality of channels;
   a detector which detects power of the modulated wave of the desired channel;
   a comparator which outputs, as a detection signal, a differential voltage of an output signal of said detector and a reference voltage which indicates a level at which no saturation of an output signal of said first power amplifier is caused;
   a first timing signal generating section which, on the basis of the detected signal outputted from said comparator, generates a first timing signal for controlling said first variable attenuator at a fixed amount of attenuation corresponding to the differential voltage from a time at which the detected signal indicates that the output signal exceeds the reference voltage to a time at which the receiving slot of the channel has been completed;
   a holding circuit which, on the basis of the first timing signal, holds the output of said comparator and outputs the first control signal;
   an A/D converter for converting the output signal of said holding circuit to a digital signal;
   a storing device which effects a write/read operation of output data converted by said A/D converter to the digital signal; and
   a second timing signal generating section which generates a second timing signal for writing the converted output data into said storing device synchronously with a timing of the receiving slot, and
   wherein a transmitter of said transmitter-receiver comprises:
       a third timing signal generating section which, synchronously with the transmitting slot, generates a third timing signal for reading out the digital data of a receiving slot corresponding to the transmitting slot, which the digital data is written in said storing device;
       a fourth timing generating portion which, synchronously with a timing of the transmitting slot, generates a fourth timing signal to be controlled at a fixed amount of attenuation from beginning to end of the transmitting slot;
       a D/A converter which, on the basis of the fourth timing signal, converts and holds the data read out from said storing device to an analog signal, and outputs a second control signal;
       a second variable attenuator which attenuates an input signal at a variable amount of attenuation on the basis of the second control signal; and
       a second power amplifier which amplifies power at a fixed gain so that when an amount of attenuation in said second variable attenuator is 0 decibels, a transmitter output signal is equal to a transmission power in the mobile station.

5. A transmitter-receiver according to claim 4, further comprising:
   an integrator which integrates one of the output signal of said detector and a signal obtained on the basis of the output signal; and
   a computing unit which performs addition of the output signal of said integrator and the output signal of said holding circuit.

6. A transmitter-receiver according to claim 4, wherein when the detected signal indicates that the output signal exceeds the reference voltage and when the receiving slot of the desired channel has been completed, the detected signal outputted from said comparator is held by said holding circuit synchronously with a rising edge of the timing signal.

7. A transmitter-receiver according to claim 6, wherein the timing, at which said second timing signal generating section generates the second timing signal and writes data into said storing device, is immediately before the receiving slot has been completed, and at this time, a signal which indicates a region corresponding to the receiving slot is synchronously outputted to said storing device.

8. A transmitter-receiver according to claim 7, wherein the timing, at which said third timing generating section generates the third timing signal and reads the signal from said storing device, is at the beginning of the transmitting slot, and at this time, a signal, a which indicates a region in which data of the receiving slot stored in said storing device is stored, is outputted to said storing device synchronously.

9. A transmitter-receiver for transmitting and receiving modulated waves of a plurality of channels in which a plurality of slots are assigned by a time division multiplexing method, said transmitter-receiver being provided in a base station, which effects a receiving and transmitting operation with a plurality of mobile stations, wherein a receiver of said transmitter-receiver comprises:

an antenna which receives a modulated wave of each of the plurality of channels, the wave being transmitted from each of the mobile stations at a fixed transmission power;

a first variable attenuator which attenuates an input signal at a variable amount of attenuation on the basis of a first control signal;

a first power amplifier which amplifies power at a fixed gain;

a circuit which extracts a modulated wave of a desired channel out of the modulated waves of the plurality of channels;

a detector which detects power of the modulated wave of the desired channel;

a comparator which compares an output signal of said detector and a reference voltage indicating a level at which no saturation of an output signal of said first power amplifier is caused, and outputs a detection signal which indicates whether the output signal exceeds the reference voltage;

a first timing signal generating section which, on the basis of the detection signal outputted from said comparator, generates a first timing signal for controlling said first variable attenuator at a fixed amount of attenuation from a time at which the detection signal indicates that the output signal exceeds the reference voltage to a time at which the receiving slot of the channel has been completed;

a first holding circuit which, on the basis of the first timing signal, holds one of a first signal which indicates that an amount of attenuation in said first variable attenuator is 0 decibel and a second signal which indicates that the amount of attenuation in said first variable attenuator is a fixed positive value, and outputs the first control signal;

a storing device which effects a write/read operation of the control signal from said first holding circuit; and a second timing signal generating section which generates a second timing signal for writing data corresponding to one of the first signal and the second signal held by said first holding circuit into said storing device synchronously with the timing of the receiving slot, and wherein a transmitter comprises:

a third timing signal generating section which, synchronously with the transmitting slot, generates a third timing signal for reading out the data of a receiving slot corresponding to the transmitting slot, which data is written in said storing device;

a fourth timing signal generating section which, synchronously with a timing of the transmitting slot, generates a fourth timing signal to be controlled at a fixed amount of attenuation from beginning to end of the transmitting slot;

a second holding circuit which, on the basis of the fourth timing signal and the data, holds one of the first signal and the second signal and outputs a second control signal;

a second variable attenuator which attenuates an input signal at a variable amount of attenuation on the basis of the second control signal; and a second power amplifier which amplifies power at a fixed gain so that when an amount of attenuation in said second variable attenuator is 0 decibels, a transmitter output signal is equal to the transmitting power in the mobile station.

10. A transmitter-receiver according to claim 9, further comprising:

an integrator which integrates one of the output signal of said detector and a signal obtained on the basis of the output signal; and a computing unit which performs addition of the output signal of said integrator and the output signal of said holding circuit.

11. A transmitter-receiver according to claim 9, wherein when the detected signal indicates that the output signal exceeds the reference voltage and when the receiving slot of the desired channel has been completed, the detected signal outputted from said comparator is held by said holding circuit synchronously with a rising edge of the timing signal.

12. A transmitter-receiver according to claim 11, wherein the timing, at which said second timing signal generating section generates the second timing signal and writes data into said storing device, is immediately before the receiving slot has been completed, and at this time, a signal which indicates a region corresponding to the receiving slot is synchronously outputted to said storing device.

13. A transmitter-receiver according to claim 11, wherein the timing, at which said third timing signal generating section generates the third timing signal and reads the signal from said storing device, is at the beginning of the transmitting slot, and at this time, a signal, which indicates a region in which data of the receiving slot stored in said storing device is stored, is outputted to said storing device synchronously.

14. A transmitter-receiver provided in a mobile station which effects a receiving and transmitting operation for a base station by using a receiving slot and a transmitting slot of one channel out of receiving slots and transmitting slots assigned in a plurality of channels by a time division multiplexing method, wherein a receiver of said transmitter-receiver comprises:

an antenna which receives a modulated wave of each of the plurality of channels, the wave being transmitted from the base station at a fixed transmission power;

a first variable attenuator which attenuates an input signal at a variable amount of attenuation on the basis of a first control signal;

a first power amplifier which amplifies power at a fixed gain;

a circuit which extracts a modulated wave of a desired channel out of the modulated waves of the plurality of channels;

a detector which detects power of the modulated wave of the desired channel;

a comparator which compares an output signal of said detector and a reference voltage indicating a level at which no saturation of an output signal of said first power amplifier is caused, and outputs a detected signal which indicates whether the output signal exceeds the reference voltage;

a first timing signal generating portion which, on the basis of the detected signal outputted from said comparator, generates a first timing signal for controlling said first variable attenuator at a fixed amount of attenuation from a time at which the detected signal indicates that the output signal exceeds the reference voltage to a time at which the receiving slot of the channel has been completed; and a holding circuit which, on the basis of the first timing signal, holds the output of said comparator and outputs the first control signal, and wherein a transmitter of said transmitter-receiver comprises:

a second variable attenuator which attenuates an input signal at a variable amount of attenuation on the basis of the first control signal of said holding circuit; and a second power amplifier which amplifies power at a fixed gain so that when an amount of attenuation in said second variable attenuator is 0 decibels, a transmitter output signal is equal to a transmission power in the base station.

15. A transmitter-receiver according to claim 14, further comprising:

an integrator which integrates one of the output signal of said detector and a signal obtained on the basis of the output signal; and a computing unit which performs addition of the output signal of said integrator and the output signal of said holding circuit.

16. A transmitter-receiver according to claim 14, wherein when the detected signal indicates that the output signal exceeds the reference voltage and when the receiving slot of the desired channel has been completed, the detected signal outputted from said comparator is held by said holding circuit synchronously with a rising edge of the timing signal.

17. A transmitter-receiver provided in a mobile station which effects a receiving and transmitting operation for a base station by using a receiving slot and a transmitting slot of one channel from receiving slots and transmitting slots assigned in a plurality of channels by a time division multiplexing system, wherein a receiver comprises:

an antenna which receives a modulated wave of each of the plurality of channels, the wave being transmitted from the base station at a fixed transmission power;

a first variable attenuator which attenuates an input signal at a variable amount of attenuation on the basis of a first control signal;

a first power amplifier which amplifies power at a fixed gain;

a circuit which extracts a modulated wave of a desired channel from modulated waves of the plurality of channels;

a detector which detects power of the modulated wave of the desired channel;

a comparator which outputs, as a detection value, a differential voltage of an output signal of said detector and a reference voltage which indicates a level at which no saturation of an output signal of said first power amplifier is caused;

a first timing signal generating section which, on the basis of the detected signal outputted from said comparator, generates a first timing signal for controlling said first variable attenuator at a fixed amount of attenuation corresponding to the differential voltage from a time at which the detected signal indicates that the output signal exceeds the reference voltage to a time at which the receiving slot of the channel has been completed;

a holding circuit which, on the basis of the first timing signal, holds the output signal of said comparator and outputs the first control signal, and wherein a transmitter of said transmitter-receiver comprises:

a second variable attenuator which attenuates an input signal at a variable amount of attenuation on the basis of the first control signal of said holding circuit; and a second power amplifier which amplifies power at a fixed gain so that when an amount of attenuation in said second variable attenuator is 0 decibels, a transmitter output signal is equal to a transmission power in the base station.

18. A transmitter-receiver according to claim 17, further comprising:

an integrator which integrates one of the output signal of said detector and a signal obtained on the basis of the output signal; and a computing unit which performs addition of the output signal of said integrator and the output signal of said holding circuit.

* * * * *